(12) United States Patent
Iwasaki et al.

(10) Patent No.: US 6,855,619 B2
(45) Date of Patent: Feb. 15, 2005

(54) METHOD AND DEVICE FOR MAKING SUBSTRATES

(75) Inventors: Atsushi Iwasaki, Tokyo (JP); Bruno Ghyselen, Seyssinet (FR)

(73) Assignee: S.O.I. Tec Silicon on Insulator Technologies S.A., Bernin (FR)

( * ) Notice: Subject to any disclaimer, the term of this patent is extended or adjusted under 35 U.S.C. 154(b) by 9 days.

(21) Appl. No.: 10/239,869

(22) PCT Filed: Apr. 2, 2001

(86) PCT No.: PCT/FR01/00976

§ 371 (c)(1),
(2), (4) Date: May 28, 2003

(87) PCT Pub. No.: WO01/75196

PCT Pub. Date: Oct. 11, 2001

(65) Prior Publication Data

US 2003/0186493 A1 Oct. 2, 2003

(30) Foreign Application Priority Data

Apr. 3, 2000 (FR) .............................. 00 4210

(51) Int. Cl.[7] .......................................... H01L 21/322
(52) U.S. Cl. ..................................... 438/475; 438/513
(58) Field of Search .............................. 438/475, 455, 438/458, 474, 513, 514, 406, 407, 459, 460, 461, 311, 914, 915

(56) References Cited

U.S. PATENT DOCUMENTS

| | | | | |
|---|---|---|---|---|
| 6,225,190 B1 | | 6/1998 | Kroner et al. | 438/424 |
| 5,877,070 A | * | 3/1999 | Goesele et al. | 438/458 |
| 6,059,877 A | * | 5/2000 | Bruel | 117/35 |
| 6,120,597 A | * | 9/2000 | Levy et al. | 117/3 |
| 6,150,239 A | | 11/2000 | Goesele et al. | 438/458 |

FOREIGN PATENT DOCUMENTS

| | | |
|---|---|---|
| DE | 2427645 | 1/1976 |
| EP | 0851465 | 7/1998 |
| FR | 2752768 | 3/1998 |
| FR | 2774510 | 8/1999 |
| JP | 10093122 | 4/1998 |
| WO | WO 0061841 | 10/2000 |

OTHER PUBLICATIONS

Behr et al., "Lift–off technique of homoepitaxial CVD diamond films by deep implantation and selective etching" Diamond and Related materials, NL, Elsevier Science Publishers, amsterdam, vol. 6, No. 5–7 pp. 654–657 (1977).

Weldon et al., "Mechanism of Silicon Exfoliation by Hydrogen Implantation And He, Li and C0–Implantation", IEEE International SOI Conference, US, New York, NY. IEEE, vol. Conf. 23, pp. 124–125 (1997).

* cited by examiner

*Primary Examiner*—David Nhu
(74) *Attorney, Agent, or Firm*—Winston & Strawn LLP

(57) ABSTRACT

The invention concerns a method for making substrates, in particular for optics, electronics or optoelectronics. The method includes an operation which consists in implanting (100) atomic species beneath the surface of a material in the form of a cylindrical ingot (1), at a depth of implantation distributed about a certain value by bombardment of the atomic species on a zone of the ingot (1) cylindrical surface, and an operation which consists in removing (300), at a separation depth located proximate to the depth of implantation, the layer (2) of material located between the surface and the separation depth, to remove the layer (2) from the rest of the cylindrical ingot (1).

30 Claims, 7 Drawing Sheets

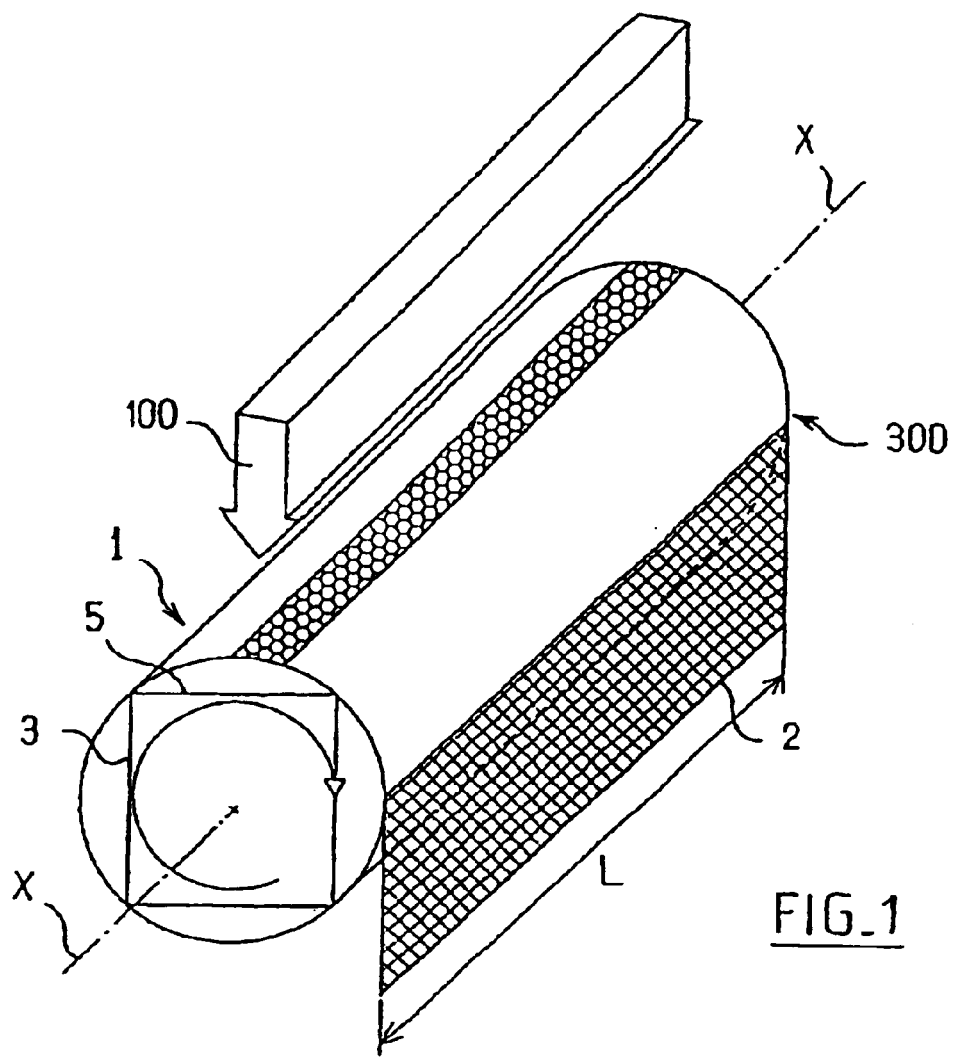
FIG_1
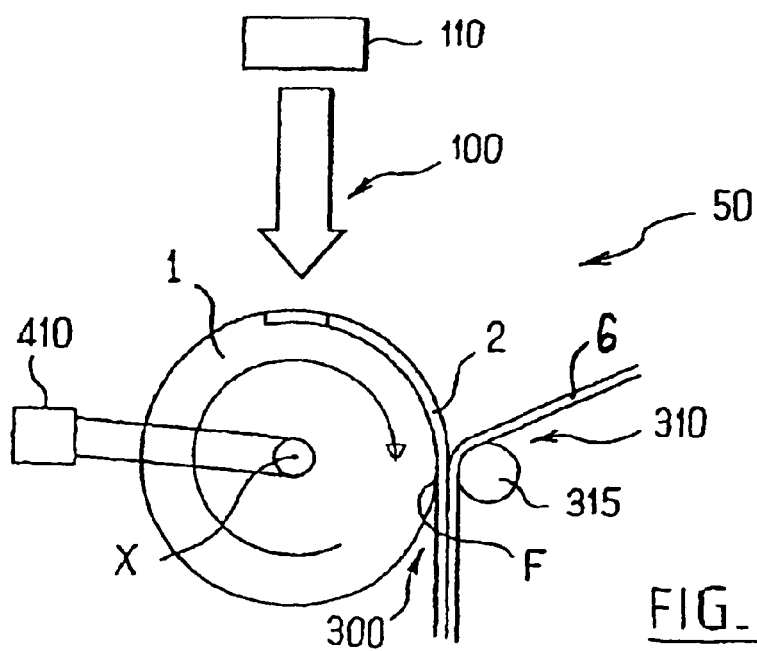
FIG_2

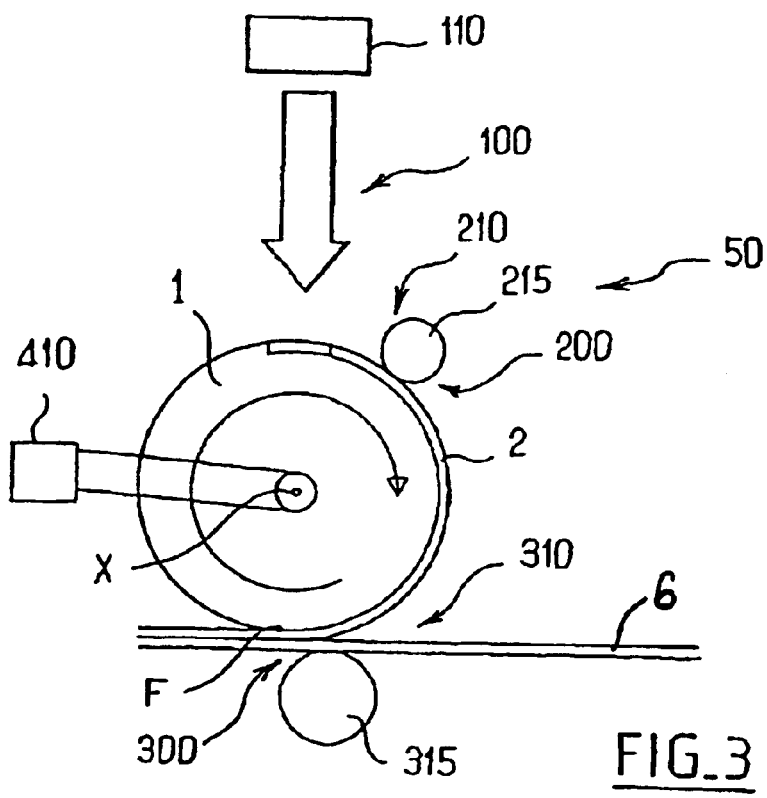
FIG_3
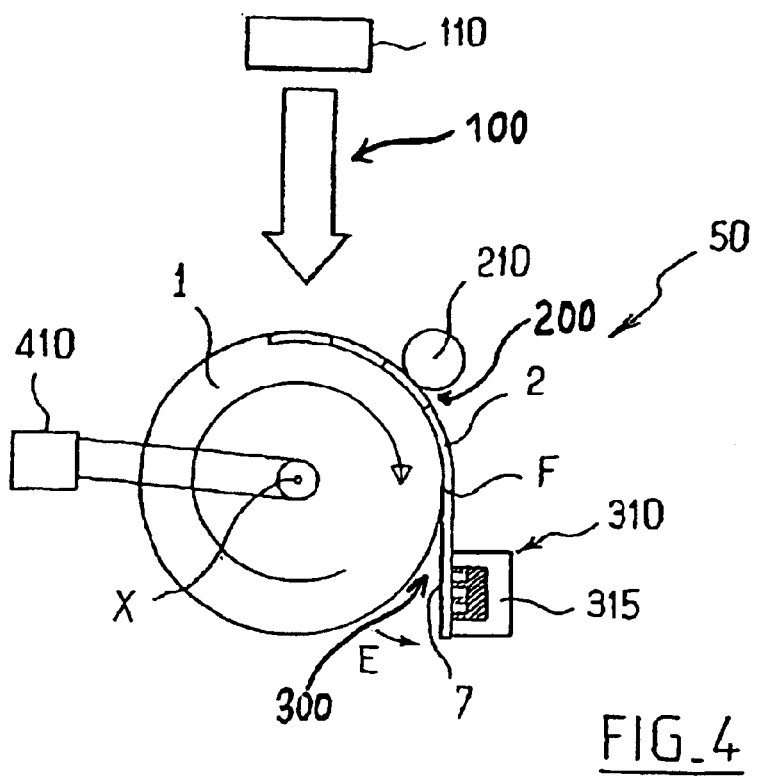
FIG_4

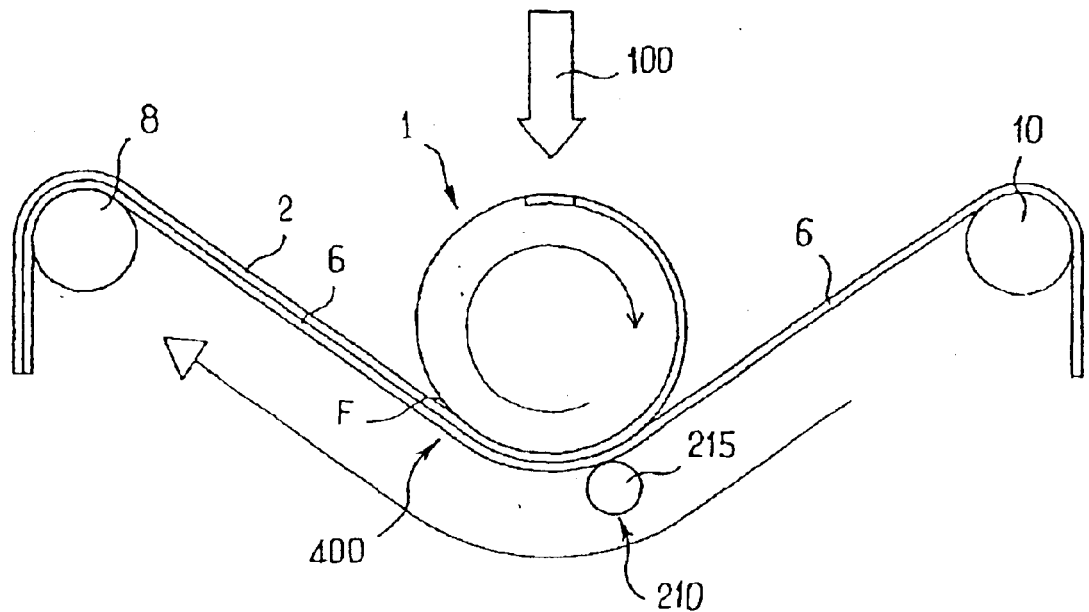
FIG_7
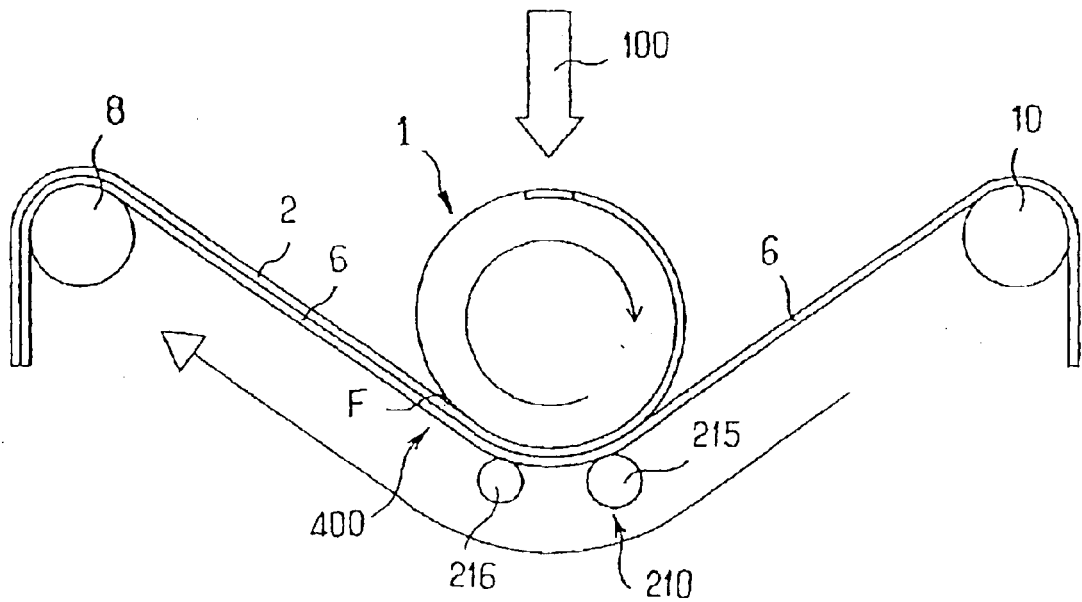
FIG_8

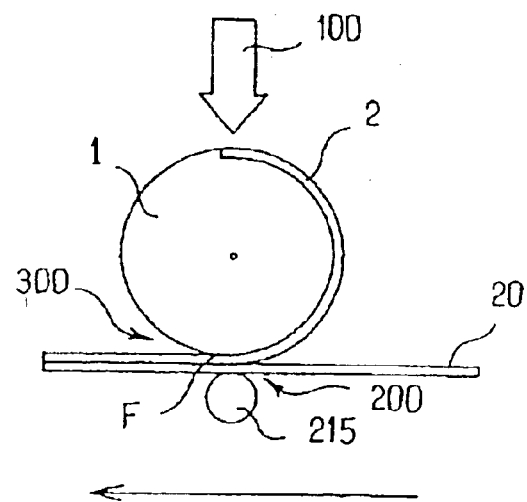
FIG_9
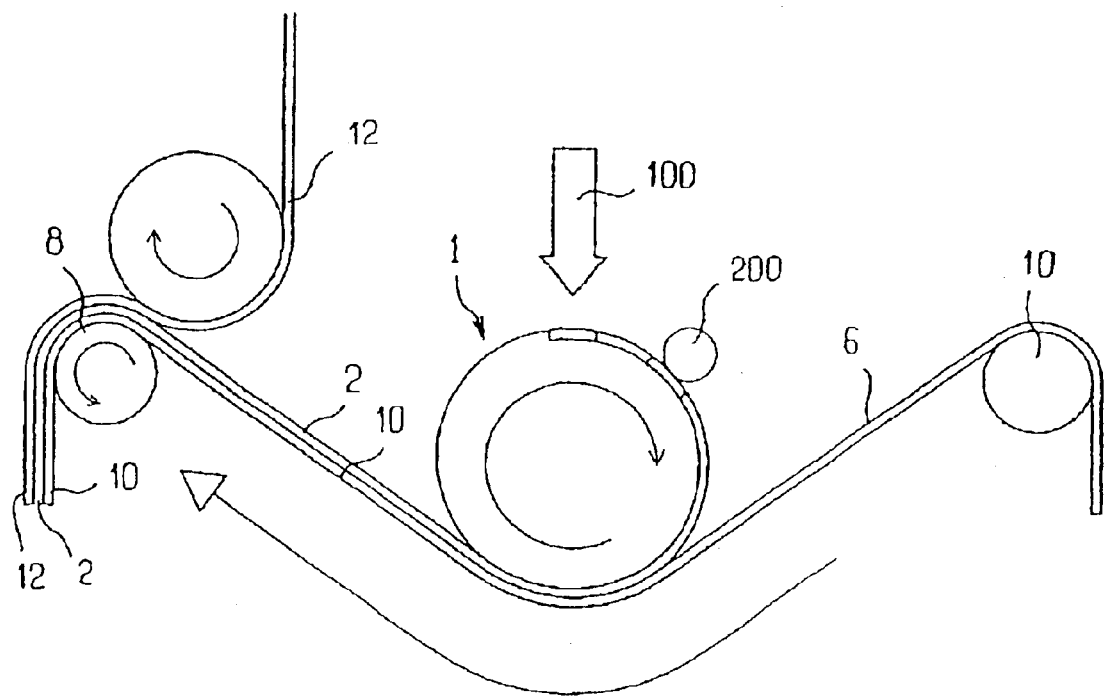
FIG_10

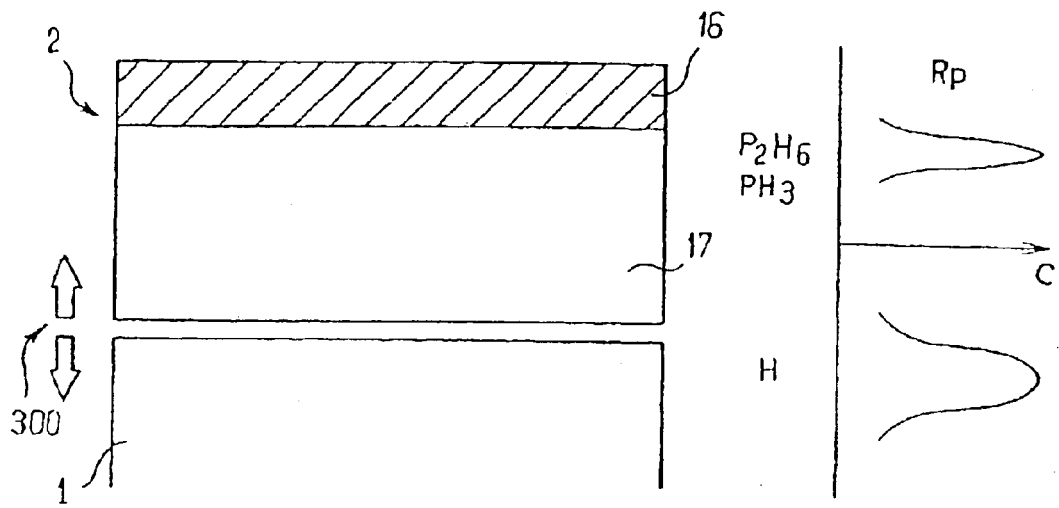
FIG_11a  FIG_11b
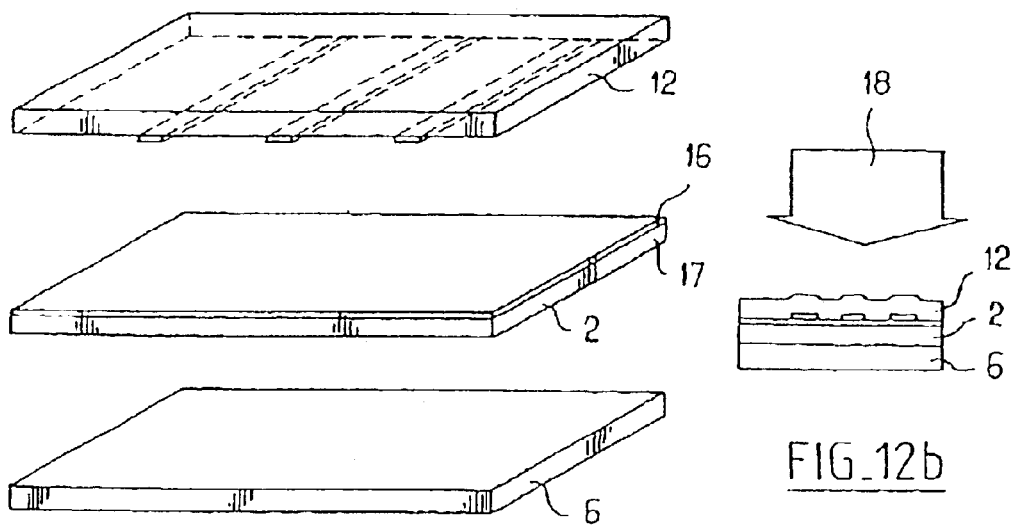
FIG_12a  FIG_12b

METHOD AND DEVICE FOR MAKING SUBSTRATES

This is a nationalization of PCT/FR01/00976, filed Apr. 2, 2001 and published in French.

BACKGROUND ART

The invention relates to the fabrication of substrates, in particular for optics, electronics or opto-electronics.

Substrates for use in the aforementioned fields are generally obtained industrially by cutting up ingots. In the case of monocrystalline silicon, for example, the ingots are obtained from a bath of molten silicon by the Czochralski drawing method (referred to hereinafter as CZ drawing) or from a polycrystalline ingot by the zone fusion method (referred to hereinafter as FZ drawing). These growing methods produce cylindrical ingots which are then cut into slices perpendicular to the axis of the cylinder, generally using an internal cut circular saw.

However, the above methods do not produce substrates with satisfactory dimensions for some applications. This applies in particular in the field of fabrication of large substrates that can be used to make flat or other shape display screens or solar cells.

To obtain larger monocrystalline silicon substrates, the document FR 2 752 768 proposes cutting ingots parallel to their longitudinal axis.

BRIEF SUMMARY OF THE INVENTION

One object of the invention is to propose another way of fabricating substrates from ingots.

Another object of the invention is to obtain substrates of a monocrystalline material, such as monocrystalline silicon, for example, with lower production costs than with prior art methods.

That object is achieved by a method of fabricating substrates, in particular for optics, electronics or opto-electronics, the method being characterized in that it includes:

an operation of implanting atomic species under the surface of a material in the form of a cylindrical ingot at an implantation depth distributed around a particular value by bombarding said atomic species onto an area of the cylindrical surface of the ingot, and a detachment operation at a detachment depth in the vicinity of the implantation depth of the layer of material between the surface and the detachment depth to detach that layer from the remainder of the ingot.

Thus in accordance with the invention a substrate is obtained by peeling off the surface layer of a cylindrical ingot parallel to the axis of the cylinder.

It must be understood that the term "substrate" is used throughout this text in the widest sense of the term, in other words to designate either an element of material able to serve as a support for another element or a thick or thin, rigid or flexible, etc. film or layer.

The terms "cylinder" and "cylindrical" must also be understood in their primary sense. In this sense, a cylinder is a solid body generated by a straight line that moves parallel to itself along the surface of a curve. In this text a cylinder can therefore have a round cross section or a polygonal cross section.

The method according to the invention advantageously enables continuous fabrication of substrates.

Because the method according to the invention can be implemented continuously, it increases the productivity of the fabrication of substrates and therefore reduces production costs. The method is particularly beneficial if it is required to fabricate monocrystalline silicon substrates at low cost, for example.

The method according to the invention has the following advantageous features, independently or in combination:

the implantation of the atomic species is effected by continuously bombarding the cylindrical surface of the ingot with a localised beam that is swept in the longitudinal direction of the ingot while the ingot rotates about an axis parallel to the cylindrical surface;

the implantation of the atomic species is effected by continuously bombarding the cylindrical surface of the ingot with a beam of elongate cross section corresponding to a given area while the ingot rotates about an axis parallel to the cylindrical surface;

the implantation of the atomic species is effected by bombardment corresponding to a given area of successive zones adjacent the cylindrical surface of the ingot while the ingot rotates about an axis parallel to the cylindrical surface of the ingot between each bombardment and the next;

the implantation of the atomic species is effected by continuously bombarding the whole of the cylindrical surface of the ingot, for example by immersing the ingot in a plasma;

it further includes an operation of heating the cylindrical surface; the heating operation can be carried out before, during or after implantation; the heating operation can be carried out by the implantation itself; the heating operation reduces the necessary dose of atomic species implanted and/or encourages in situ healing of some implantation defects;

it includes an operation of transferring the layer of material between the cylindrical surface of the ingot and the detachment depth onto a support;

it includes an operation of pressing the layer of material between the cylindrical surface of the ingot and the detachment depth by means of a roller; this pressing operation causes a thermal shock if the roller is cooled or heats the ingot if it is heated and/or applies mechanical pressure and/or shear stresses to encourage and/or cause detachment from the ingot of the layer of material between the cylindrical surface of the ingot and the detachment depth;

the support is adhesive;

it includes an operation of covering the layer of material between the cylindrical surface of the ingot and the detachment depth with a liquid phase or gas phase deposit;

the material is silicon;

the atomic species comprise hydrogen ions;

the atomic species comprise doping ions such as phosphorus, arsenic or boron ions;

it includes operations of applying a layer to each face of the layer of material between the cylindrical surface of the ingot and the detachment depth by rolling those layers between rollers;

it includes an operation of transferring at least one layer comprising circuitry patterns onto the layer of material between the cylindrical surface of the ingot and the detachment depth.

For the fabrication of display screens and solar cells in particular, amorphous or polycrystalline silicon deposited on a glass substrate is often used, because monocrystalline silicon can be deposited on glass, on quartz, etc. at present only by layer transfer techniques using a monocrystalline silicon substrate to form the layer that is transferred onto the glass substrate. The diameter of monocrystalline silicon substrates is limited at present to 200 mm or even 300 mm.

Using the method according to the invention, it is possible to fabricate larger monocrystalline silicon substrates. Even if the monocrystalline silicon substrates obtained with some variants of the method according to the invention do not have a perfect crystalline orientation, they have better qualities than amorphous or polycrystalline silicon. Thus when they are used to make flat screens they offer an improvement in terms of integration density (number of pixels per unit surface area), screen refresh rate, etc. When they are used to make solar cells they increase the efficiency of photoelectric conversion.

Whether the substrates are small or large, the fact that the method of fabricating them can be implemented continuously reduces their cost.

Note that the initial diameter of the ingot is of little importance, but its length is more important. As a general rule, the greater the diameter of an ingot the shorter its length. Accordingly, depending on the intended applications, it is preferable to use an ingot of smaller diameter, because it is easier to obtain in a greater length. However, the layer made by the method according to the invention is obtained from the cylindrical surface of an ingot. In some embodiments of the method according to the invention, this layer can initially be given a curvature that can prove critical in some circumstances. For example, if the layer is to be stored on a cylinder with the curvature reversed, mechanical stresses can be generated that degrade the quality of the layer, or even cause it to break. As the diameter of the ingot increases, these curvature problems can become less severe.

It can also be beneficial to use large-diameter ingots if it is necessary to reduce the period in the resulting layer of variation of its crystalline orientation with the direction in which it is wound.

What is more, the curvature and crystallographic orientation problems referred to above are considerably reduced, or even non-existent, if the method according to the invention is used with ingots which have a square cross section, for example. In this case, the layer made by the method according to the invention is obtained from plane faces whose crystallographic orientation is clearly defined.

A 200 mm diameter ingot is typically 1.5 m long. As a general rule, before they are used in the method according to the invention, these ingots are cut into 40 to 50 cm lengths.

What is more, an ingot as drawn has an ill-defined exterior shape (undulating diameter, etc). During a preliminary step of the method according to the invention, the ingot is turned or machined to obtain an ingot in the form of a regular cylinder or having a polygonal cross section. The turning or machining operation is carried out before or after the cutting operations previously referred to.

With silicon ingots, a layer of the order of 10 $\mu$m thick is obtained by implanting hydrogen ions with energies of the order of 1 MeV. However, what is essential is to have a sufficiently rigid mass of material between the detachment depth and the surface of the ingot to avoid problems associated with the fragility and deformability of the layers.

The detachment depth is advantageously determined so that the continuous layers formed by the method according to the invention are self-supporting.

In an advantageous variant of the method according to the invention the layer is reinforced to prevent problems associated with its fragility or deformability by depositing a film before the detachment operation or even before the heating operation, if any, or even before the implantation operation. This variant is particularly advantageous when it is required to fabricate layers that are too thin to be self-supporting. In the case of silicon, for example, a 10 $\mu$m deposit of $SiO_2$ proves sufficient to reinforce the mechanical strength of the layer formed (a material other than $SiO_2$ can equally well be used). As a general rule, and therefore not only for applications of the method according to the invention to the fabrication of silicon layers, deposition methods of the epitaxial, atomisation, paint, spray, etc. type are also feasible.

The amounts of the atomic species implanted are advantageously of the order of $10^{17}$ to $10^{18}/cm^2$. With these amounts, and a depth of penetration of the order of one to several tens of microns, it is possible to separate the layer of material between the surface and the detachment depth from the remainder of the ingot with no additional heating operation and with the application of limited stresses or even no stresses.

As a general rule, if stresses are applied to the layer, they are advantageously mechanical stresses (shear, tension, compression, ultrasound, etc.), electrical stresses (electrostatic or electromagnetic field), thermal stresses (radiation, convection, conduction, etc.), etc. Applying stresses can also entail directing onto the layer/ingot detachment interface a jet of fluid (liquid or gas) that is either continuous or varies in time. Thermal stresses in particular can be derived from the application of an electromagnetic field, an electron beam, thermo-electric heating, a cryogenic fluid, a supercooled liquid, etc.

Another aspect of the invention provides a device for fabricating substrates, in particular for use in optics, electronics or opto-electronics, which device is characterized in that it includes:

means for implantation of atomic species under the surface of a material in the form of a cylindrical ingot at an implantation depth distributed around a particular value, detaching means for detaching a layer of material at a detachment depth in the vicinity of the implantation depth, and rotation means for rotating a cylindrical ingot of the material about an axis parallel to the cylindrical surface of the ingot.

The above device implements the method according to the invention as previously described. It advantageously includes means for holding the layer of material between the cylindrical surface of the ingot and the detachment depth to gather up said layer after it is detached from the ingot. The holding means advantageously include a plurality of reversible gripping means distributed over roller drive means. The principle of such gripping means is known in the art. Such gripping means employ pressure differences, electrostatic forces, etc., for example.

BRIEF DESCRIPTION OF THE DRAWINGS

Other aspects, objects and advantages of the invention will become apparent on reading the following detailed description. The invention is explained with reference to the drawings, in which:

FIG. 1 is a diagrammatic perspective view of an ingot subjected to ion implantation and to the detachment of a layer of material by a first embodiment of the substrate fabrication method according to the invention;

FIG. 2 is a diagrammatic view of one example of a substrate fabrication device according to the present invention, in cross section relative to the axis of the cylinder of the ingot shown in FIG. 1;

FIG. 3 is a diagrammatic view of the use of a second embodiment of the method according to the present invention, in cross section relative to the axis of the cylinder of an ingot like that shown in FIGS. 1 and 2;

FIG. 4 is a diagrammatic view of the use of a third embodiment of the method according to the present invention, in cross section relative to the axis of the cylinder of an ingot like that shown in FIGS. 1 to 3;

FIG. 7 is a diagrammatic view of the use of a fourth embodiment of the method according to the present invention, in cross section relative to the axis of an ingot like that shown in FIGS. 1 to 6;

FIG. 8 is a diagrammatic view of the use of a fifth embodiment of the method according to the present invention, in cross section relative to the axis of an ingot like that shown in FIGS. 1 to 7;

FIG. 9 is a diagrammatic view of the use of a variant of the fourth embodiment of the method according to the present invention, in cross section relative to the axis of an ingot like that shown in FIGS. 1 to 7;

FIG. 10 is a diagrammatic view of the use of a sixth embodiment of the method according to the present invention, in cross section relative to the axis of an ingot like that shown in FIGS. 1 to 9;

FIG. 11a is a diagrammatic view of a substrate obtained with a seventh embodiment of the method according to the invention, in section perpendicular to the surface subjected to bombardment by the method according to the invention, and FIG. 11b is a diagram showing the concentration profile of the atomic species implanted as a function of the depth of implantation in the substrate shown in FIG. 11a;

FIG. 12a is a diagrammatic perspective view of three layers intended to be superposed in an eighth embodiment of the method according to the invention and FIG. 12b shows the structure obtained after assembling the three layers shown in FIG. 12a;

DETAILED DESCRIPTION OF THE PREFERRED EMBODIMENTS

Figure 5:
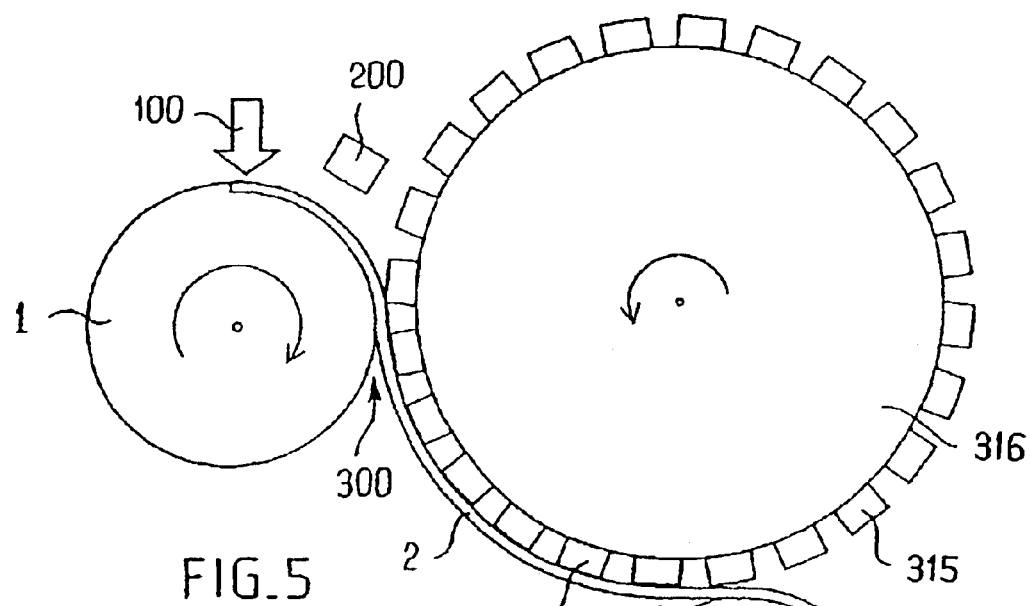
FIG. 5 is a diagrammatic view of the use of a variant of the embodiment of the method according to the present invention shown in FIG. 4, in cross section relative to the axis of the cylinder of an ingot such as that shown in FIGS. 1 to 4.

The method according to the present invention is described hereinafter in the particular context of obtaining monocrystalline silicon substrates from an ingot obtained by CZ or FZ drawing. Silicon has been chosen because it is by far and away the most widely used material in the field of micro-electronics. However, the invention is not limited to this material. The invention applies generally to ingots of any monocrystalline, polycrystalline or amorphous materials, in particular semiconductors.

FIG. 1 shows an ingot 1 of monocrystalline silicon obtained by the CZ or FZ drawing process. It is approximately the shape of a circular cylinder with an axis X—X. The ingot 1 initially has a diameter of 200 mm and a length L=1.5 m and is usually cut into lengths. The drawing process is chosen to obtain an ingot 1 in which the faces perpendicular to the axis of the cylinder are oriented parallel to the <1, 0, 0> crystallographic plane. The <0, 0, 1> plane 3 and the <0, 1, 0> plane 5 are therefore parallel to the axis X—X of the ingot 1.

Ten examples of implementation of the method according to the invention are described hereinafter.

EXAMPLE 1

In the first example, shown in FIG. 1, the method according to the invention includes an operation 100 of implanting atomic species and a detachment operation 300.

In this example, the atomic species are $H^-$ ions. They are implanted with a high energy. The beam made up of these ions is elongate in the longitudinal direction of the ingot. To obtain a 10 $\mu$m thick layer 2 of silicon the $H^-$ ions are accelerated with an energy of 725 keV. The amount of $H^-$ ions implanted is $1.21 \times 10^{17}/cm^2$.

The implantation operation 100 is carried out by sweeping a beam of accelerated atomic species over the surface of the ingot 1, over the whole of its length, matching the rotation speed of the ingot 1 to the width of the beam and to the sweeping rate to obtain the appropriate dose.

The implantation depth Rp varies according to the crystallographic orientation of the implanted surface relative to the incident beam of atomic species. In applications in which variations in the thickness of the layer 2 are critical, modulation of the thickness of the layer 2 obtained is advantageously avoided by modulating the implantation energy as a function of the rotation angle. Note, however, that if an ingot 1 which has a square cross section is used, these problems of thickness variations can be reduced or even eliminated, because the implantation can be effected on faces whose crystallographic orientation is clearly defined.

The implantation operation 100 creates, within the volume of the ingot 1, and at a depth close to the depth of penetration of the $H^-$ ions, a fragile layer dividing the ingot 1 into a lower region constituting the mass of the ingot 1 and an upper region constituting a layer 2 of material destined to form the required substrate.

In the example described here the layer 2 is approximately 10 $\mu$m thick. That thickness is sufficient to avoid deformation of the layer (for example the formation of blisters) and the implantation conditions produce sufficient fragility at the detachment depth for the layer 2 to be detached from the ingot 1 with less force.

The separated layer 2 is advantageously held to enable it to be unwound.

FIG. 2 shows a device 50 in accordance with the invention for fabricating substrates which implements the method illustrated by FIG. 1. It includes means 110 for implanting $H^-$ ions, means 310 for holding the layer 2 when it has been separated from the ingot 1, and rotation means 410.

The implantation means 110 comprise an implanter which produces $H^-$ ions accelerated to an energy of the order of 1 MeV. This type of implanter was initially developed by the Japan Atomic Energy Research Institute (JAERI).

The rotation means 410 cause the ingot 1 to rotate about the axis X—X.

The holding means 310 comprise a support 6. The support 6 is advantageously an adhesive film. The layer 2 is brought directly into contact with the support 6. The support 6 is pressed against the layer 2 by an applicator roller 315. The applicator roller 320 is mounted on a shaft that is mobile so that it can track the movement of the surface of the ingot 1 as its diameter is decreased by the removal of material. Accordingly, when the ingot 1 begins to rotate about the axis X—X, before it has been implanted, no transfer of the layer 2 onto the support 6 is effected. Then, when the implantation operation 100 is started, and the implanted area comes into contact with the support 6, the latter enables the layer 2 to be transferred onto the support 6. After contact with the layer 2, it separates the latter from the remainder of the ingot 1. The transfer of the layer 2 onto the support 6 can then continue.

EXAMPLE 2

A second example of implementation of the method according to the invention, shown in FIG. 3, includes an implantation operation 100, a heating operation 200 and a detachment operation 300.

The species implanted are advantageously hydrogen ions. Hydrogen ions are implanted with an energy of the order of 700 keV and a dose of the order of $10^{17}/cm^2$.

With the ingot 1 rotating continuously about its axis X—X in the device 50, the area of the surface of the ingot 1 bombarded by the atomic species during the implantation operation 100 moves towards a heating area.

The heating operation 200 is carried out after the implantation operation 100 by heating means 210. The heating operation 200 assists detaching the layer 2 between the surface and the detachment depth from the remainder of the ingot 1. The heating operation 200 enables the doses of atomic species implanted to be reduced relative to the dose referred to in example 1.

The heating means 210 consist of a heating roller 215 in the form of a circular cylinder with its axis parallel to the rotation axis of the ingot 1. The heating roller 215 is placed downstream of the implantation means 110 relative to the rotation direction of the ingot 1. The heating roller 215 is in contact with the ingot 1. The heating means 210 advantageously heat the surface of the ingot 1 locally to a temperature of around 500° C./600° C. The temperature is adjusted to suit the time of application of the heating means 210 and the implantation conditions, such as the implantation dose and energy. The dose and energy parameters also determine the temperature reached by the surface of the ingot 1 during the implantation operation 100. This heating of the ingot 1 by implantation is taken into account in the thermal budget which determines the conditions of detachment of the layer 2 from the remainder of the ingot 1. The time of application of the heating means 210 also depends on the application surface area, the rotation speed of the ingot 1, etc.

The layer 2 is then transferred onto a support 6, as described in example 1.

EXAMPLE 3

A third example of implementation of a device 50 for implementing a method according to the invention, shown in FIG. 4, includes an implantation operation 100 and a heating operation 200, like those of example 2, plus a detachment operation 300 performed with the aid of holding means 310.

The holding means 310 can employ a pressure difference, an electrostatic force, a reversible adhesion force (by application of a low-tack adhesive), etc.

If the holding means 310 are of the suction type, they advantageously comprise a bar 315 with its length parallel to the axis X—X of the ingot 1. The bar 315 is hollow. The pressure inside the bar is reduced to hold the layer 2 reversibly by suction. Detachment of the layer 2 from the remainder of the ingot 1 is encouraged by the heating operation 200.

To begin peeling the layer 2 off the ingot 1, the holding means 310 are applied to the first area of the ingot 1 that has been subjected to the implantation operation 100 and the heating operation 200. Because of the suction in the bar 315, mechanical stresses are applied to the layer 2. Those mechanical stresses are reinforced by movement E of the bar 315 away from the ingot 1. A separation front F is then obtained.

Figure 6:
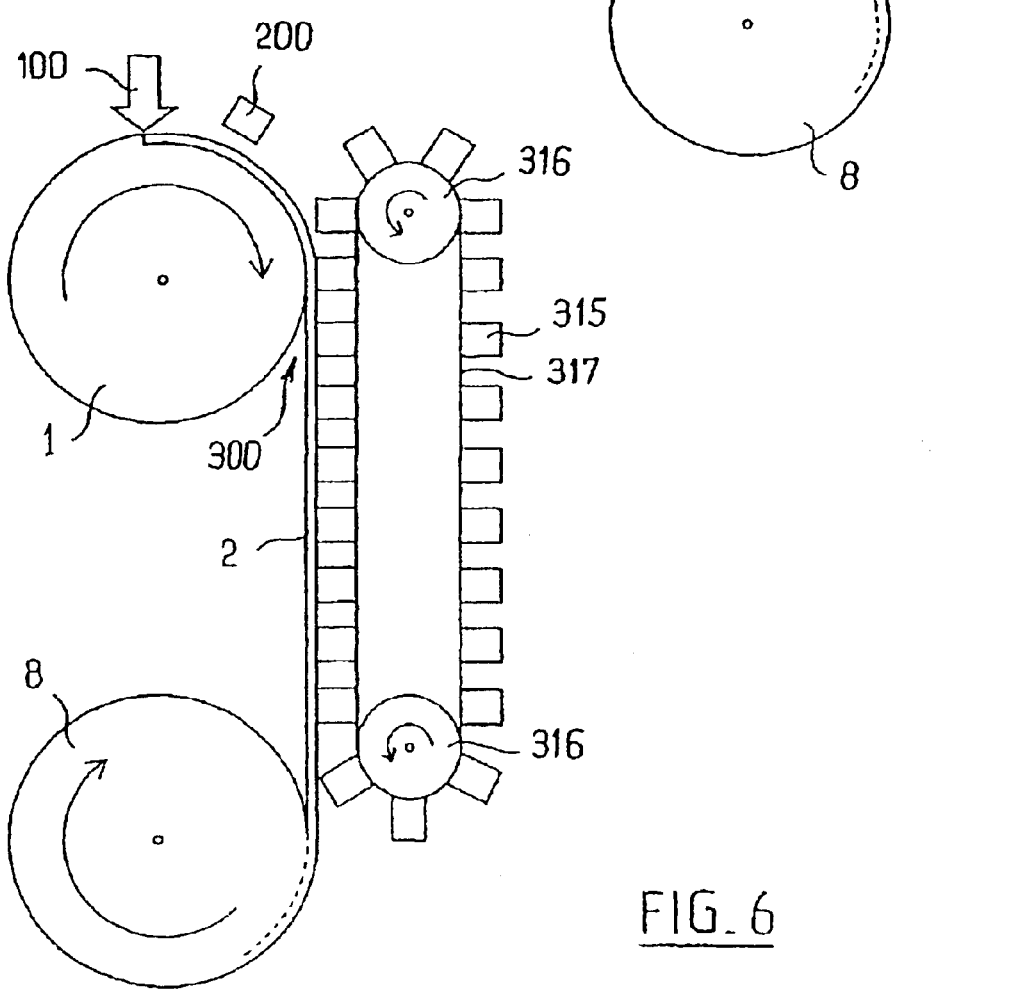
FIG. 6 is a diagrammatic view of the use of another variant of the embodiment of the method according to the present invention shown in FIG. 4, in cross section relative to the axis of the cylinder of an ingot such as that shown in FIGS. 1 to 5.

The holding means 310 are moved by the means shown in FIGS. 5 and 6, for example.

In the embodiment shown in FIG. 5, bars 315 are distributed over the periphery of a drive roller 316. The principle of FIG. 6 is the same as that of FIG. 5, but the bars 315 are distributed over a conveyor belt 317 moving in a straight line between two drive rollers 316.

In the embodiments shown in FIGS. 5 and 6 the pressure inside the bar 315 is reduced just before it comes into contact with the ingot 1. At the moment of contact the bar 315 adheres to the surface of the ingot 1. If the ingot has not been subjected to the implantation operation 100 and the heating operation 200, in the area of contact between the ingot 1 and the bar 315 the latter move relative to each other and the contact is broken. On the other hand, if the ingot has been subjected to an implantation operation 100 in the area of contact between the ingot 1 and the bar 315, the layer 2 is separated from the remainder of the ingot 1 and is held by the bar 315. The vacuum in the bar 315 is broken when the area of the layer 2 held by the bar 315 reaches a take-up roller 8.

This embodiment has the advantage over the previous embodiment that the layer 2 is subject to lower mechanical stresses because there is no reversing of the curvature of the layer 1 between the detachment operation 300 and the operation of storing it on the take-up roller 8. holding means 310 and entrained by the support 6.

In a variant of these embodiments of the method according to the invention, the layer 2 is transferred to a support (not shown in FIGS. 5 and 6). In this case, the layer 2 is moved away from the ingot 1 by the holding means 310, as previously indicated, and then transferred to the support, to which it adheres. The layer 2 is then released by the holding means 310 and entrained by the support.

In this variant the layer 2 can be cut into sheets before or after it is transferred to the support 6.

EXAMPLE 4

A fourth example of implementation of the method according to the invention includes an implantation operation 100, an operation 400 of transfer onto a stiffener support 6, and a heating operation 210 carried out before or during the transfer operation 400.

This is shown in FIG. 7.

In this example, the implantation operation 100 is carried out at an energy of 100 to 200 keV. This energy is insufficient to produce self-supporting layers 2. The support 6 then acts as a stiffener. This prevents the layer 2 breaking and/or deforming (by forming blisters, for example).

The support 6 is advantageously an adhesive film. The adhesive film consists of a polymer resin, for example, or some other substance suited to this function, which becomes adhesive when it is heated or when it is irradiated with UV radiation. The adhesive film is stretched between two rollers 8, 10 between which the ingot 1 is pressed onto the support 6. The axes of the rollers 8, 10 and the ingot 1 are parallel. The support 6 is initially wound onto a pay-out roller 10.

The ingot 1 is rotated about its axis X—X by rotation means 410.

In this example the heating means take the form of a roller 215. The roller presses the support 6 and the layer 2 together and heats them at the same time. The support 6 serves as a stiffener which prevents deformation of the layer 2 (for example by blisters) that could otherwise occur during the heating operation that is virtually simultaneous with the coming into contact of the layer 2 and the support 6. The heating operation 210 strengthens the adhesion between the support 6 and the layer 2 and contributes to making the ingot 1 fragile at the detachment depth.

After adhering to the support 6, the layer 2 leaves the ingot 1 at the separation front F. Synchronizing the rotation of the ingot 1 with the movement of the support 6 propagates the separation of the layer 2 relative to the ingot 1 at the front F. At the separation front F, the material is sufficiently fragile for the mechanical stresses applied to the ingot 1 by the support 6 to complete detachment.

If the implantation and heating parameters are chosen accordingly, the detachment of the layer 2 from the ingot 1 has already occurred by the time of the heating operation 200 and the support 6 merely entrains the layer 2 away from the ingot 1.

The combination of the layer 2/support 6 is then wound onto a take-up roller 8 for storage.

As an alternative to the above, the support 6 can be preheated before it is brought into contact with the ingot 1 or the ingot 1 can be preheated before the support 6 is brought into contact with it.

In another variant of the embodiment of the method according to the invention described hereinabove a wedge, blade or some other type of mechanical contact or a jet of fluid, such as a gas, is used to initiate the separation of the layer 2 from the ingot 1.

In a further variant of this embodiment, the support 6 takes the form of a plate 20 (see FIG. 9). The plate 20 is rigid. It is made of glass or quartz, for example. Thus an implantation operation 100 can be carried out after which the layer 2 is transferred to the plate 20; it can be heated to facilitate detachment and transfer of the layer 2 onto the plate 20 and adhesion of the layer to the plate. It is also possible to interrupt the implantation operation 100 to complete the transfer of a portion of the layer 2 already implanted onto the plate 20 and then start again with a new plate 20.

EXAMPLE 5

A fifth example of implementation of the method according to the invention is derived from the fourth example, illustrated by FIG. 7. The fifth example, illustrated by FIG. 8, includes an implantation operation 100, a heating operation 200 and an operation 400 of transfer onto a stiffener support 6, as in the fourth example, but further includes an operation that creates a thermal shock. After the implantation operation 100, the ingot 1 is at a relatively high temperature. By pressing a cooling roller 216 against the ingot 1 in the areas that have been subjected to the implantation operation, a thermal shock is produced that facilitates separating the layer 2 and the ingot 1.

EXAMPLE 6

A sixth example of the implementation of the method according to the invention includes an implantation operation 100, a heating operation 200 and a detachment operation 300, all of which are of the same kind as those of example 4. However, it further includes an operation of covering the layer 2 deposited on the support 6 with a covering material 12. The covering material 12 is deposited in the form of a film or in the liquid or gas phase. This example is illustrated by FIG. 10. A system of three layers 6, 2 and 16 is then obtained. One example of use of an embodiment of this kind is described hereinafter in example 8.

EXAMPLE 7

A seventh example of implementation of the method according to the invention includes an implantation operation 100 which is advantageously effected simultaneously with $H^-$ ions and phosphorus ions (FIG. 11a). With the same acceleration energy, the $H^-$ ions are implanted more deeply than the phosphorus ions, because they are not so heavy. The $H^-$ ions therefore determine the depth at which detachment occurs. The phosphorus ions produce an n-doped doping layer 16. The layer underlying the doping layer 16 forms a p-doped layer 17. FIG. 11b shows the profile of the concentration C of the atomic species $H^-$, $P_2H_6$ and $PH_3$ as a function of the depth of implantation in the layer 2 and the ingot 1 shown in FIG. 11a. Thus doping and implantation for the purpose of detachment can be carried out at the same time.

This example is advantageously completed by a heating operation 200, a detachment operation 300 and a transfer operation 400 as described in example 4.

EXAMPLE 8

An eighth example of implementation of the method according to the invention is derived from the sixth and seventh examples described hereinabove. In the eighth example, shown in FIGS. 12a and 12b, the support 6 and the covering material 12 already incorporate patterns.

FIG. 12a shows a support 6, a layer 2 and a covering material 12. The support 6 includes interconnection patterns (not shown). The silicon layer 2 is obtained from a silicon ingot 1 by the method according to the invention. The layer 2 includes an n-doped layer 16 that is advantageously doped with phosphorus or arsenic and a p-doped layer 17, as indicated hereinabove in example 7. The covering material 12 also includes interconnection patterns. The combination of the three layers 6, 2 and 12 is assembled by the method according to the present invention, for example the variant of the method illustrated by FIG. 6. This produces a photovoltaic device like that shown in FIG. 12b, in which the face including the covering material 12 is exposed to the photons 18.

The covering material 12 provides an antireflection coating. The surface of the layer 2 is rough because it has not been polished after the detachment operation 300 of the method according to the present invention. This enables light 18 to penetrate into the layer 2 with multiple reflections.

EXAMPLE 9

Figure 13A:
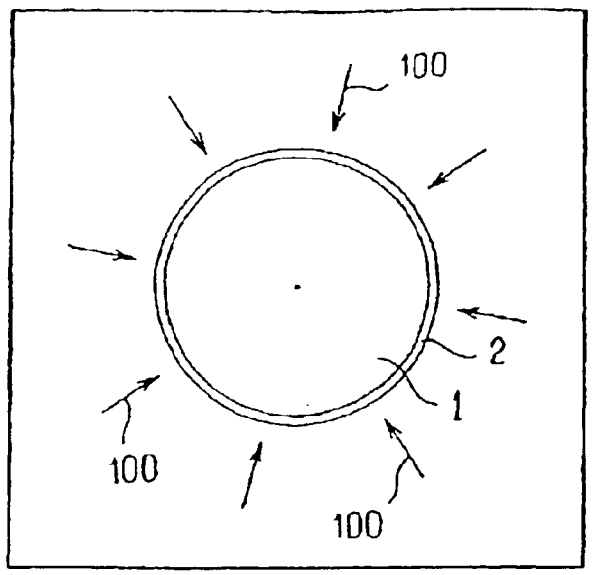
FIG. 13 is a diagrammatic view of the use of a ninth embodiment of the method according to the present invention, in cross section relative to the axis of the cylinder of the ingot shown in FIGS. 1 to 10.
Figure 13B:
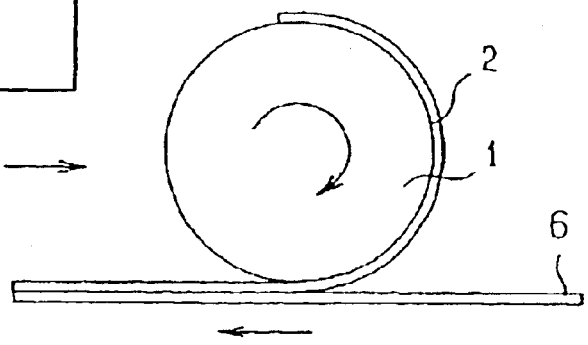

In a ninth example of implementation of the method according to the invention, shown in FIGS. 13a and 13b, the implantation operation 100 is carried out over the whole of the surface of the ingot 1. To this end the ingot 1 is placed in a plasma implantation chamber in which the atomic species are accelerated to the required voltage (FIG. 13a).

The ingot 1 is then optionally subjected to a heating operation 200, depending on the conditions used in the preceding implantation operation 100.

The ingot 1 is then withdrawn from the implantation chamber to peel off the layer 2. The layer 2 is advantageously transferred onto a support 6, as in any of the preceding examples (FIG. 13b).

In a variant of this example the ingot 1 is subjected to the other operations leading to the formation of the layer 2 in the same chamber as the implantation operation 100.

EXAMPLE 10

Figure 14:
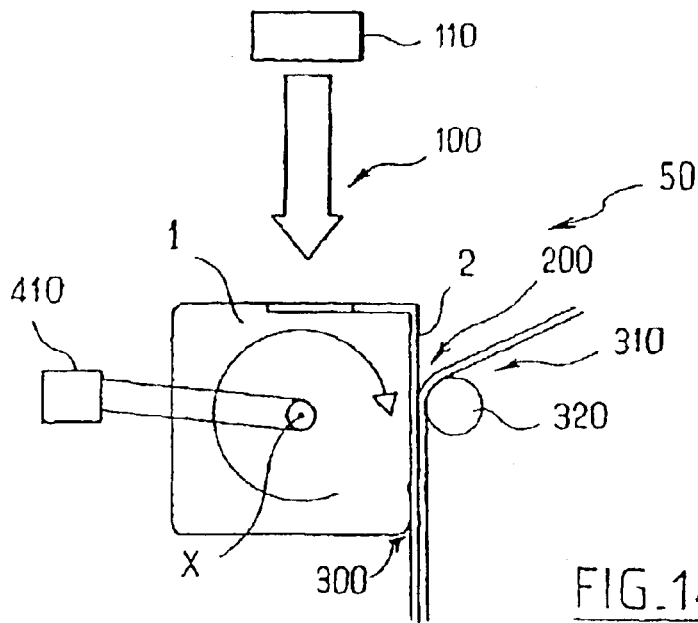
FIG. 14 is a diagrammatic view of a square cross section ingot used in a variant of the present invention, in cross section relative to the axis of the ingot.

A tenth example of implementation of the method according to the invention by using a device 50, shown in FIG. 14, includes an implantation operation 100, a healing operation 200, and a detachment operation 300, conforming to those described in connection with example 2, but the ingot 1 has a square cross section relative to its longitudinal axis. The heating operation 200 and the detachment operation 300 are carried out simultaneously by means of a heating roller 215. The heating roller 215 is mounted on a shaft that is mobile so that it can track the movement of the faces of the ingot 1 as it rotates and so that it can track the movement of the surface of the ingot 1 as its size is reduced by removing material.

Many variants of the method according to the invention can be obtained by combining the various embodiments described hereinabove.

In the embodiments described hereinabove, the implantation operation 100 is carried out by bombarding the surface of the ingot 1 either with a beam of atomic species or by immersion in a plasma. If a beam of atomic species is used, it can have a linear or rectangular shape or any other geometry. The ingot 1 can also be bombarded radially by more than one beam, simultaneously at several points on the surface, or even over the whole of its surface.

In the embodiments described hereinabove, a heating operation 200 can be carried out to encourage and/or cause detachment of the layer 2 from the ingot 1. That operation can be complemented by the application of mechanical stresses to complete said detachment and separate the layer 2 from the remainder of the ingot 1. However, the detachment of the layer 2 from the ingot 1 can be encouraged and/or caused entirely by the heating operation 200. It can also be encouraged and/or caused entirely by mechanical stresses.

Similarly, in the embodiments described hereinabove, the atomic species implanted to create microcavities is hydrogen. Other atomic species can equally well be used. Examples are helium, boron, etc. Boron is advantageously used to dope the layer at the same time as encouraging or causing detachment. Boron can equally advantageously be used to reduce the doses of the atomic species implanted and/or the temperatures and/or the times of heating of the optional heating operation 200 (see U.S. Pat. No. 5,877,070, for example).

For some applications, and in particular if the surface of the ingot 1 exposed to implantation must be protected, a buffer layer can be deposited on the upstream side of the implantation 100, relative to the direction of rotation of the ingot 1.

Similarly, it can be beneficial to deposit a stiffener on the ingot 1, even before the implantation operation 100.

As a general rule, depending on the intended applications, it can be beneficial to deposit a support 6 (stiffener, reflecting layer, etc.) on one or both of its faces before or after the layer 2 is peeled off.

In a further variant of the method according to the invention, the layer 2 is transferred temporarily to a support 6 serving as a stiffener enabling a detachment operation 300 to be carried out, or even only a operation constituting a preliminary to the detachment operation, such as a heating operation 200, preventing deformations such as those caused by the formation of blisters. The support 6 advantageously carries the layer 2 from the ingot 1 from which it has been obtained to storage means or carries the layer 2 before it is transferred to another support that confers the required mechanical strength on it. Thus one face of the layer 2 can adhere temporarily to the temporary support 6, which possibly also serves as a stiffener, after which another support is caused to adhere to the other face, after which the temporary support 6 is finally removed.

A roller in contact with the ingot 1 downstream of the implantation means 110 can also serve as a temporary stiffener. This is advantageously combined with a heating operation 200.

What is claimed is:

1. A method of fabricating substrates, in particular for optics, electronics or opto-electronics, comprising an operation (100) of implanting atomic species under a surface of a material in a form of a cylindrical ingot (1) at an implantation depth distributed around a particular value by bombarding said atomic species onto an area of a cylindrical surface of the cylindrical ingot (1), and a detachment operation (300) at a detachment depth in the vicinity of an implantation depth of a layer (2) of material between the surface and the detachment depth to detach that layer (2) from a remainder of the cylindrical ingot (1).

2. A method according to claim 1, wherein implanting atomic species is effected by continuously bombarding the cylindrical surface of the cylindrical ingot (1) with a localised beam that is swept in a longitudinal direction of the cylindrical ingot while the cylindrical ingot is rotated about an axis parallel to the cylindrical surface.

3. A method according to claim 1, wherein implanting atomic species is effected by continuously bombarding the cylindrical surface of the cylindrical ingot (1) with a beam of elongate cross section corresponding to a given area while the cylindrical ingot is rotated about an axis parallel to the cylindrical surface.

4. A method according to claim 1, wherein implanting atomic species is effected by bombardment corresponding to a given area of successive zones adjacent the cylindrical surface of the cylindrical ingot (1) while the cylindrical ingot (1) rotates about an axis parallel to the cylindrical surface of the cylindrical ingot (1) between each bombardment and the next.

5. A method according claim 1, characterized in that all of the cylindrical surface of the cylindrical ingot (1) is bombarded.

6. A method according to claim 5, characterized in that all of the cylindrical surface of the cylindrical ingot (1) is continuously bombarded by immersing the cylindrical ingot (1) in a plasma.

7. A method according to claim 1, characterized in that it further includes a heating operation (200).

8. A method according to claim 1, characterized in that it includes an operation of transferring the layer (2) of material between the cylindrical surface of the cylindrical ingot (1) and the detachment depth onto a support (6).

9. A method according to claim 8, characterized in that it includes an operation of pressing the layer (2) of material between the cylindrical surface of the cylindrical ingot (1) and the detachment depth onto the support (6) by means of a cooling roller (216).

10. A method according to claim 8, characterized in that the support (6) is adhesive.

11. A method according to claim 1, characterized in that it includes an operation of covering the layer (2) of material between the cylindrical surface of the cylindrical ingot (1) and the detachment depth with a liquid-phase or gas-phase deposit.

12. A method according to claim 1, characterized in that said material is silicon.

13. A method according to claim 1, characterized in that the atomic species comprise hydrogen ions.

14. A method according to claim 13, characterized in that the atomic species comprise doping ions such as phosphorus or arsenic ions.

15. A method according to claim 1, characterized in that it includes operations of applying a layer (6, 12) to each face of the layer (2) of material between the cylindrical surface of the cylindrical ingot (1) and the detachment depth by rolling those layers between rollers.

16. A method according to claim 1, characterized in that it includes an operation of transferring at least one layer (6, 12) comprising circuitry patterns onto the layer (2) of material between the cylindrical surface of the cylindrical ingot (1) and the detachment depth.

17. A method according to claim 1, characterized in that the cylindrical ingot (1) has a circular cross section.

18. A method according to claim 1, characterized in that the cylindrical ingot (1) has a square cross section.

19. A method for fabricating a substrate, comprising:
providing a cylindrical ingot of a material that is useful to form an optic, electronic or optoelectronic substrate;
implanting atomic species into the cylindrical ingot through a cylindrical exterior surface thereof to a predetermined implantation depth by bombarding the cylindrical ingot with the atomic species to form a cylindrical surface layer having a thickness that essentially corresponds to the implantation depth; and
detaching the surface layer at a detachment depth that is located in the vicinity of the implantation depth to detach the layer from a remainder of the cylindrical ingot.

20. The method of claim 19, wherein the atomic species are implanted while rotating the cylindrical ingot about an axis that is parallel to the cylindrical exterior surface and longitudinally sweeping the cylindrical exterior surface with the bombarding atomic species.

21. The method of claim 20, which further comprises implanting atomic species as the cylindrical ingot rotates by at least one of continuously bombarding a portion of the cylindrical exterior surface with a localized beam that sweeps in a longitudinal direction parallel to the cylindrical exterior surface, or by continuously bombarding a given area of the cylindrical exterior surface with a beam of elongate cross section, or by successively bombarding a given area of zones adjacent the cylindrical exterior surface.

22. The method of claim 19, which further comprises simultaneously bombarding all of the cylindrical exterior surface with atomic species.

23. The method of claim 22, wherein the simultaneous bombardment is achieved by immersing the cylindrical ingot in a plasma.

24. The method of claim 19, which further comprises a heating operation for separating the cylindrical surface layer from the ingot.

25. The method of claim 19, which further comprises transferring the cylindrical surface layer onto a cylindrical support.

26. The method of claim 25, which further comprises pressing the surface layer onto the support by means of a cooling roller.

27. The method of claim 19, which further comprises covering the surface layer with at least one of a liquid-phase or a gas-phase deposit.

28. The method of claim 19, wherein the atomic species comprise doping ions.

29. The method of claim 19, which further comprises applying a first support layer and a second support layer to first and second faces of the surface layer.

30. The method of claim 19, which further comprises transferring at least one layer of circuitry patterns onto the surface layer.

* * * * *

UNITED STATES PATENT AND TRADEMARK OFFICE
CERTIFICATE OF CORRECTION

PATENT NO. : 6,855,619 B2 Page 1 of 1
APPLICATION NO. : 10/239869
DATED : February 15, 2005
INVENTOR(S) : Iwasaki et al.

It is certified that error appears in the above-identified patent and that said Letters Patent is hereby corrected as shown below:

<u>Title Page</u>:
Item (56) References Cited, U.S. PATENT DOCUMENTS, after "6,225,190 B1", delete "6/1998 Kroner et al." and insert -- 5/2001 Bruel et al. --.

Signed and Sealed this

Eighteenth Day of September, 2007

JON W. DUDAS
*Director of the United States Patent and Trademark Office*